United States Patent
Koelling

[19]

[11] Patent Number: 5,945,869
[45] Date of Patent: Aug. 31, 1999

[54] VOLTAGE DETECTOR USING BODY EFFECT

[75] Inventor: Jeffrey E. Koelling, Dallas, Tex.

[73] Assignee: Texas Instruments Incorporated, Dallas, Tex.

[21] Appl. No.: 09/073,930

[22] Filed: May 6, 1998

Related U.S. Application Data

[60] Provisional application No. 60/047,580, May 23, 1997.

[51] Int. Cl.$^6$ ........................................ H03K 3/01
[52] U.S. Cl. ........................... 327/534; 327/538; 327/541
[58] Field of Search .................... 327/534, 535, 327/536, 538, 540, 541, 543; 363/59, 60

[56] References Cited

U.S. PATENT DOCUMENTS

| | | | |
|---|---|---|---|
| 5,264,808 | 11/1993 | Tanaka | 331/57 |
| 5,530,640 | 6/1996 | Hara et al. | 363/60 |
| 5,602,506 | 2/1997 | Kim et al. | 327/535 |
| 5,721,510 | 2/1998 | Miyajima | 327/536 |
| 5,744,997 | 4/1998 | Kang et al. | 327/537 |

*Primary Examiner*—Timothy P. Callahan
*Assistant Examiner*—An T. Luu
*Attorney, Agent, or Firm*—Robert N. Rountree; Wade J. Brady; Richard L. Donaldson

[57] ABSTRACT

A circuit is designed with a first reference circuit (202) for producing a first reference voltage in response to a first voltage. A second reference circuit (204) produces a second reference voltage in response to the first voltage and a second voltage. A sampling circuit (210) stores the first reference voltage and the second reference voltage and produces a first sample voltage and a second sample voltage. A comparator circuit (222) is coupled to receive the first sample voltage and the second sample voltage. The comparator circuit produces a control signal in response to a difference between the first sample voltage and the second sample voltage. A generator circuit includes an oscillator circuit (226) and a pump circuit (230). The generator circuit produces a first supply voltage in response to the control signal.

26 Claims, 4 Drawing Sheets

5,945,869

VOLTAGE DETECTOR USING BODY EFFECT

CLAIM TO PRIORITY OF PROVISIONAL APPLICATION

This application claims priority under 35 U.S.C. § 119(e)(1) of provisional application number 60/047,580, filed May 23, 1997.

FIELD OF THE INVENTION

This invention relates to an integrated circuit and more particularly to an integrated circuit with a voltage detector using body effect.

BACKGROUND OF THE INVENTION

Present complementary metal oxide semiconductor (CMOS) synchronous dynamic random access memory (SDRAM) circuits are frequently used for main memory in a variety of applications including desk top and portable computer systems. Advances in system technology continually reduce feature sizes and gate dielectric thickness. Internal operating voltages must be closely regulated for these reduced feature sizes and gate dielectric thickness in order to maintain reliability. Moreover, this regulation must be effective over a wide range of external voltage and temperature.

Regulation of internal high voltage supplies, such as Vpp, for SDRAM circuits is particularly critical due to the relatively high electric field across the gate dielectric of memory cells during a memory operation. Large variations in high voltage supply Vpp may degrade memory cell transistor performance characteristics over time and even lead to dielectric rupture and field failure of SDRAM memory cells. Previous regulation attempts were based on detecting an increase of high voltage Vpp by an integral number of transistor threshold voltages above supply voltage Vdd. When this excess value of Vpp was detected, a Vpp supply generator circuit would be temporarily disabled until high voltage supply Vpp attained a desired value. This method, however, fails to closely regulate the value of high voltage Vpp due to a wide variation of transistor threshold variation with temperature and process parameter variations.

SUMMARY OF THE INVENTION

These problems are resolved by a circuit comprising a first transistor having a gate, a bulk terminal and a current path, wherein the bulk terminal and a first terminal of the current path of the first transistor are coupled to a first voltage supply terminal for producing a first reference voltage at a second terminal of the current path of the first transistor. A second transistor has a gate, a bulk terminal and a current path, wherein the bulk terminal of the second transistor is coupled to a second voltage supply terminal, and a first terminal of the current path of the second transistor coupled to the first supply voltage terminal for producing a second reference voltage at a second terminal of the current path of the second transistor. A comparator circuit detects a difference between the first reference voltage and the second reference voltage, and the comparator circuit produces a control signal in response to the difference.

The present invention detects a difference in transistor threshold variation due to the body effect. Voltage detection is not limited to an integral number of discrete transistor threshold values.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
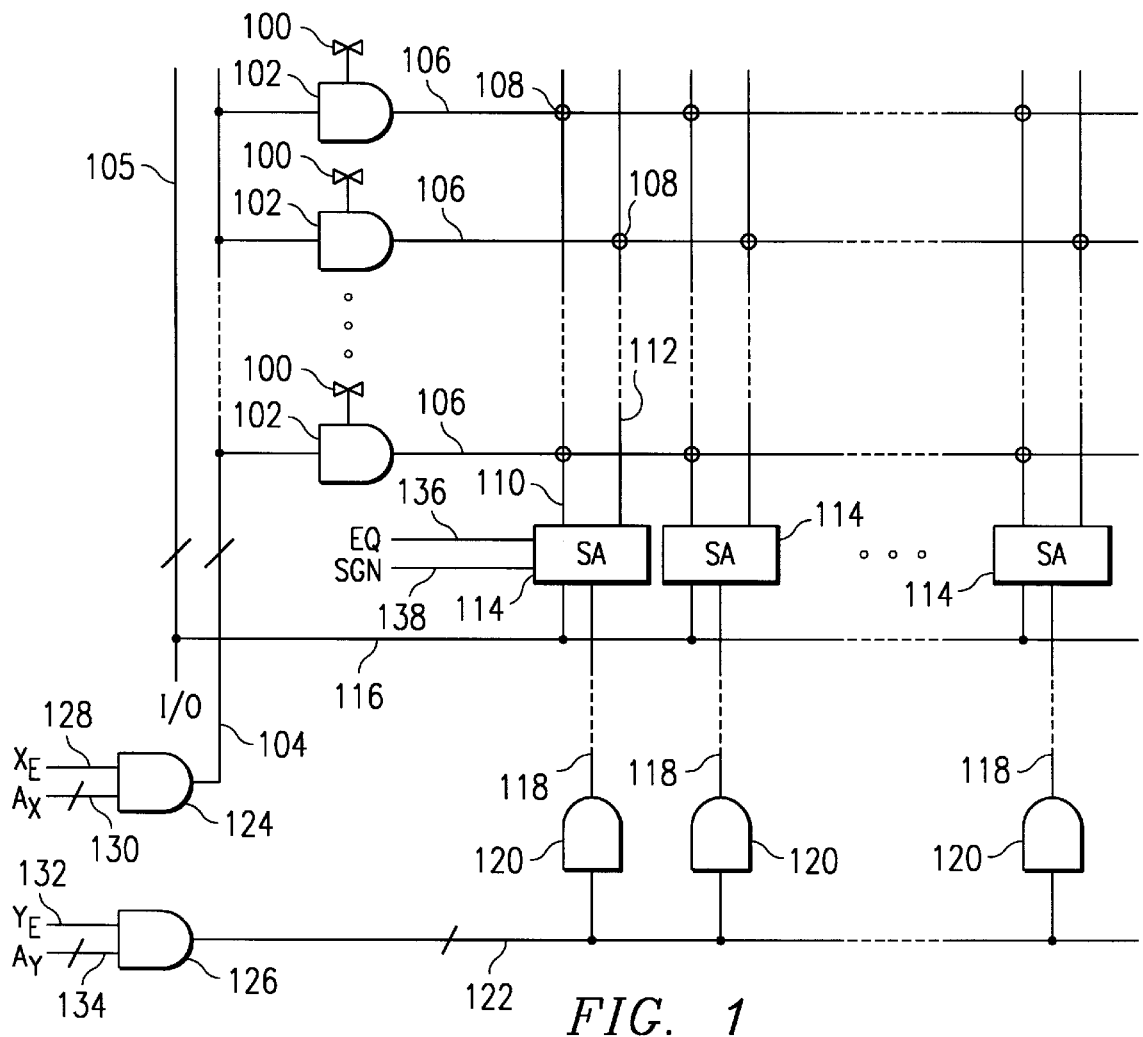
FIG. 1 is a schematic diagram of a part of a memory circuit which may employ the level detector of the present invention.

A diagram of a part of a memory circuit which may employ the level detector of the present invention as shown in FIG. 1 will be described in detail. A memory array is formed of one-transistor memory cells 108 at intersections of word lines 106 and complementary bit lines BL 110 and BLB 112. Predecoded address signals are generated on bus 104 in response to address signals AX on address bus 130 and row enable signal XE at terminal 128. One row decode circuit 102 is selected in response to these predecoded address signals. A selected word line 108 is activated by a selected row decode circuit 102 powered by high voltage supply Vpp at terminal 100. This voltage level of high voltage supply Vpp enables the control gate of each memory cell 108 along the selected word line 106 so that a fill voltage level of a respective bit line is applied to a memory cell during a write operation without loss of a transistor threshold voltage level. Each memory cell accessed by the selected word line shares charge with a respective complementary bit line BL or BLB to develop a difference voltage at each sense amplifier 114. Each sense amplifier is then activated to amplify the difference voltage and restore the voltage level in the memory cells.

Predecoded address signals are generated on bus 122 in response to address signals AY on address bus 134 and column enable signal YE at terminal 132. A column decode circuit 120 is selected in response to these predecoded address signals. A selected sense amplifier 114 then couples the amplified datum to local data bus 116. Local data bus 116 is then coupled to I/O bus 105 for producing data at respective output terminals of the memory circuit during a read operation. Alternatively, data may be applied to I/O bus 105 and subsequently written to a selected memory cell by a respective sense amplifier during a write operation.

Figure 2:
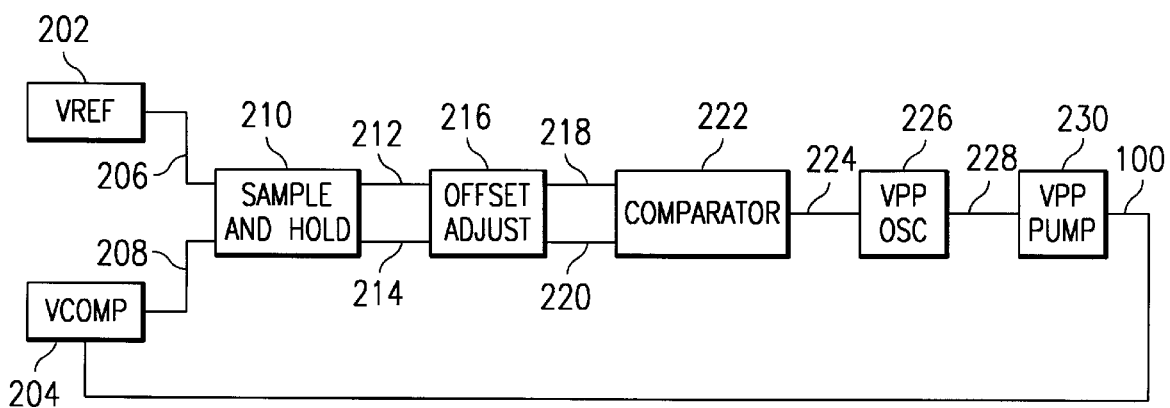
FIG. 2 is a block diagram of an embodiment of a level detector circuit and high voltage generator circuit of the present invention.

Referring now to FIG. 2, there is a block diagram an embodiment of a level detector circuit and high voltage generator circuit of the present invention for generating high voltage Vpp at terminal 100. Reference circuit 202 produces reference voltage VREF at lead 206. Reference circuit 204 produces reference voltage VCOMP at lead 208. A sample and hold circuit 210 periodically samples the reference voltages at leads 206 and 208. The difference voltage between these reference circuits is adjusted by offset adjust circuit 216. Comparator circuit 222 then amplifies the adjusted difference voltage and produces an enable signal at lead 224 for enabling a high voltage generator circuit. The high voltage generator circuit includes oscillator circuit 226 and pump circuit 230 which form a conventional diode-capacitor voltage generator as is known to those having ordinary skill in the art. Operation of oscillator circuit 226 of the high voltage generator is regulated by the enable signal at lead 224.

Figure 3:
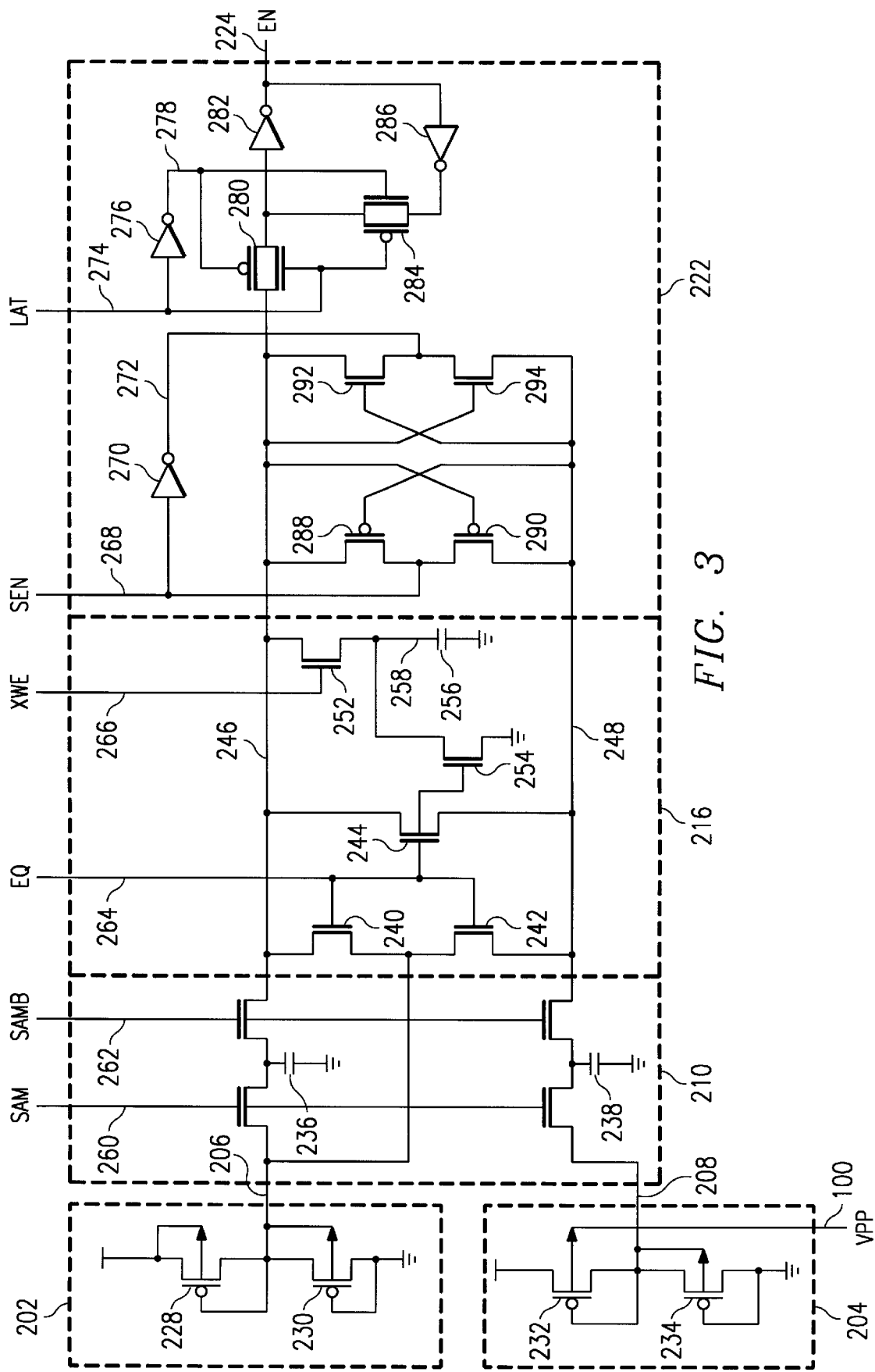
FIG. 3 is a schematic diagram of the level detector circuit of FIG. 2.
Figure 4:
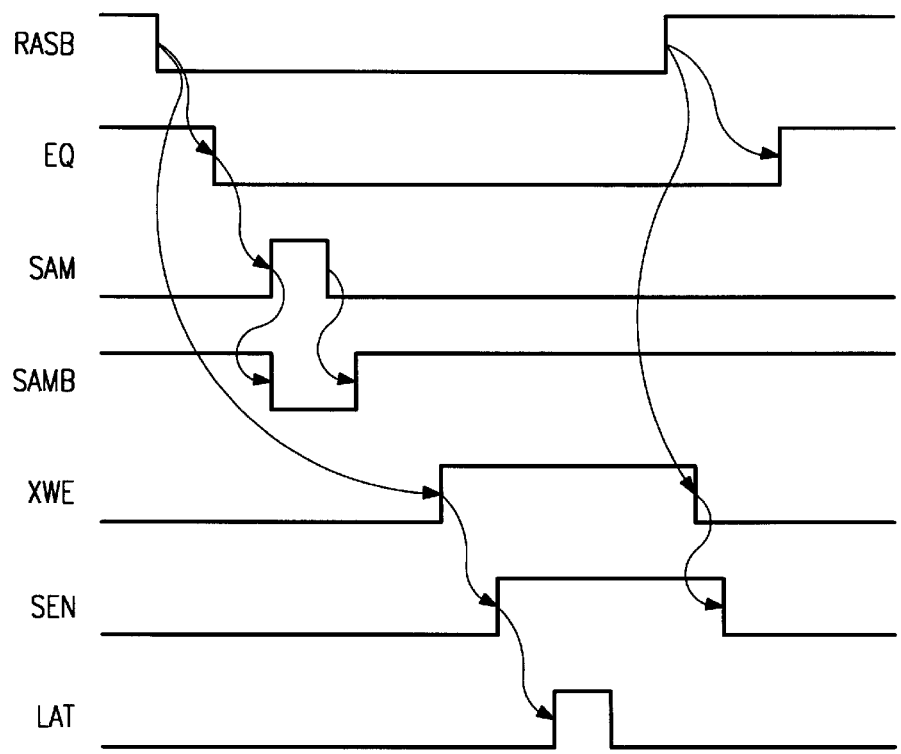
FIG. 4 is a timing diagram showing control signals of the level detector circuit of FIG. 3.
Figure 5:
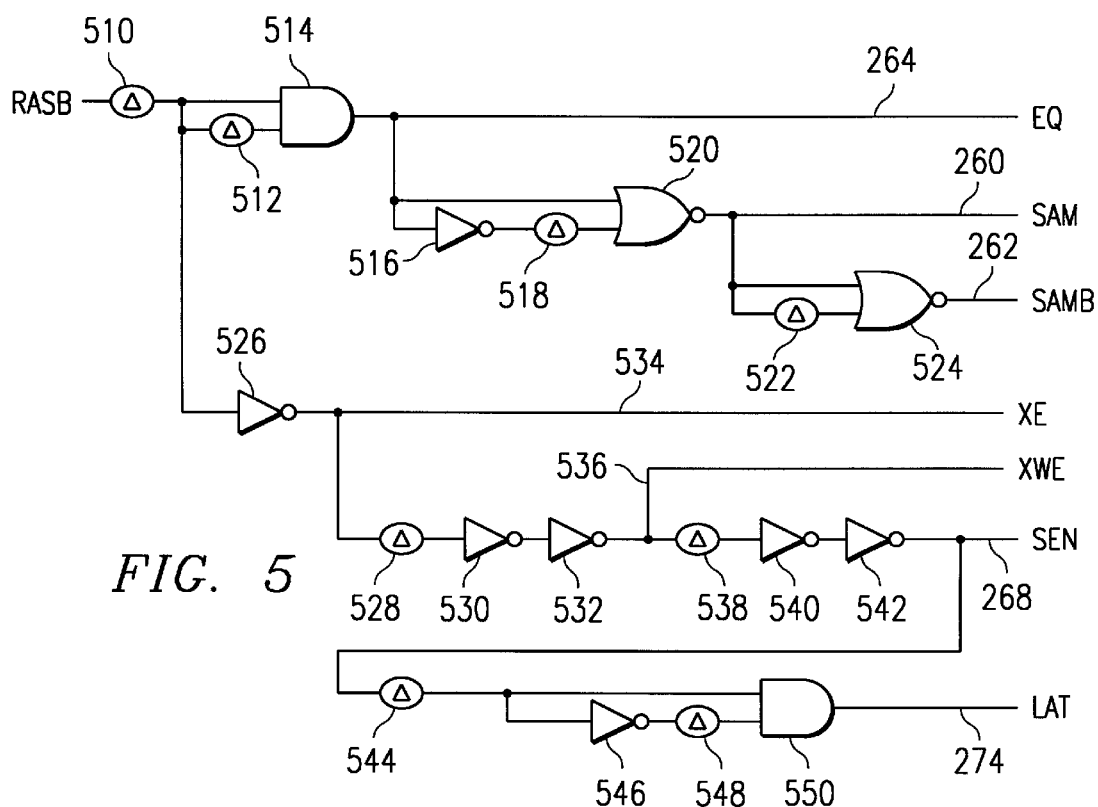
FIG. 5 is a logic diagram of a control signal generator for generating the control signals of FIG. 4.

Referring now to FIG. 3, there is a schematic diagram that will be used to describe operation of the level detector circuit of FIG. 2 in detail with reference to the timing diagram of FIG. 4 and the logic diagram of FIG. 5. Reference circuit 202 includes two series-connected P-channel transistors that form a voltage divider circuit between a terminal of positive voltage supply Vdd and a terminal of reference voltage supply Vss for producing intermediate reference voltage VREF. The bulk terminal of P-channel transistor 228 of reference circuit 202 is connected to the terminal of positive voltage supply Vdd. Reference circuit 204 also includes two series-connected P-channel transistors that form another voltage divider circuit between positive voltage supply terminal Vdd and reference voltage supply terminal Vss for producing intermediate reference voltage VCOMP. The bulk terminal of P-channel transistor 232 of reference circuit 204, however, receives high voltage supply Vpp at terminal 100. This different voltage at the bulk terminal of each P-channel transistor produces a different bulk-source voltage Vbs for each of P-channel transistors 228 and 232. This body effect causes an increase in a magnitude of the P-channel transistor threshold voltage Vth with increasing bulk-source voltage Vbs according to the equation $$Vth = Vt0 + BE[(Vbs + 2\psi f)^{1/2} - (2\psi f)^{1/2}]$$

where the Fermi potential is $$\psi f = KT \ln(Na/ni)/q$$

the body effect parameter is $$BE = t_{ox}/\epsilon_{ox}(2q\epsilon_{si}Na)$$

and Vbs is bulk-substrate voltage of the P-channel transistor. Other variables have their normal values as is known in the art.

Regulator circuit operation begins when control signal RASB goes low (FIG. 4). This causes equalization signal EQ to go low, thereby turning off N-channel transistors 240, 242 and 244 and leaving comparator input terminals 246 and 248 equalized to reference voltage VREF. Equalization signal EQ also turns N-channel transistor 254 off, leaving capacitor 256 precharged to reference supply voltage Vss. Sample pulse SAM then goes high to store a sample of reference voltages VREF and VCOMP on capacitors 236 and 238, respectively. Complementary sample pulse SAMB goes low during the sample period to isolate capacitors 236 and 238 from comparator input terminals 246 and 248, respectively. Complementary sample pulse SAMB goes high after a time established by delay circuit 522 (FIG. 5), thereby applying the sampled voltages to comparator input terminals 246 and 248, respectively. Word line enable signal XWE goes high after a time established by delay circuit 528 and inverters 530 and 532 and turns on N-channel transistor 252, thereby sharing charge between sample capacitor 236 and offset capacitor 256 at comparator input terminal 246. This charge sharing produces an offset voltage at comparator input terminal 246 that is equal to a voltage at comparator input terminal 248 when high voltage Vpp has a desired value. Thus, a difference voltage between comparator input terminals 246 and 248 indicates whether the level of high voltage Vpp is greater or less than a desired value.

Sense signal SEN then goes high to activate comparator circuit 222 including cross-coupled P-channel transistors 288 and 290 and cross-coupled N-channel transistors 292 and 294. Comparator circuit 222 amplifies the difference voltage at input terminals 246 and 248 and produces an output level at terminal 246 equal to supply voltage Vdd if high voltage Vpp is above the desired level. Alternatively, comparator circuit 222 produces an output level at terminal 246 equal to reference supply voltage Vss if high voltage Vpp is below the desired level. Latch pulse signal LAT then goes high for a time determined by inverter 546 and delay circuit 548 to latch the amplified difference voltage at terminal 246, thereby producing enable signal EN at terminal 224. This enable signal EN enables the high voltage generator circuit that produces high voltage Vpp.

Figure 6:
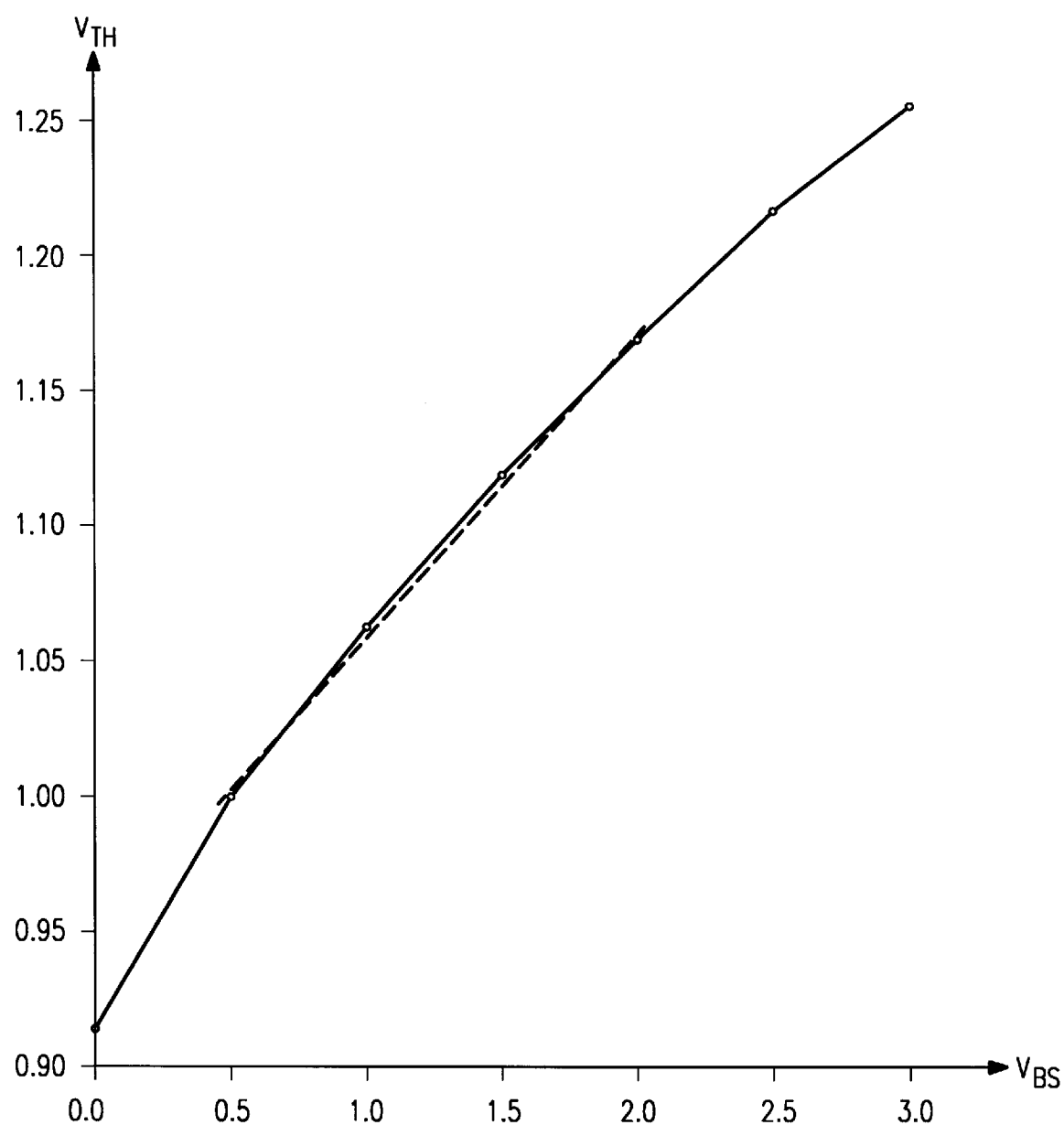
FIG. 6 is a diagram showing the relation between bulk-source voltage Vbs and transistor threshold variation over a range of interest.

This circuit offers significant advantages over reference circuits of the prior art. First, it does not depend on a discrete number of transistor threshold voltages for voltage detection. Any level of high voltage Vpp may be detected by adjusting a ratio of sample capacitor 236 to offset capacitor 256. Second, the circuit is simple and reliable and may use existing memory circuit control signals for operation. Third, the method of detection is based on variation of transistor threshold voltage due to body effect. This is highly advantageous, since Vbs is the difference between supply voltage Vdd and high voltage Vpp. This critical value of Vbs is necessary to fully restore a charge of a memory cell having a true one datum, thereby increasing data retention time for the memory circuit. Finally, this method of detection is approximately linear over the Vbs range of interest. The solid line of the graph of FIG. 6 shows the variation of transistor threshold voltage as a function of bulk-substrate voltage Vbs. The dashed line of FIG. 6 illustrates that variation of transistor threshold voltage Vth over the range of interest of voltage Vbs is approximately linear. Proper operation of the memory circuit requires a high voltage level Vpp that is greater than one N-channel transistor threshold voltage above supply voltage Vdd or, alternatively, the most positive bit line voltage. This N-channel transistor threshold voltage may be approximately 1.2 volts with body effect. A desired value for high voltage Vpp, therefore, is approximately 1.5 volts above positive supply voltage Vdd resulting in a Vbs of about 1.5 volts. Thus, linear response of the detector above and below 1.5 volts is highly advantageous for reliable detection and regulation.

Although the invention has been described in detail with reference to its preferred embodiment, it is to be understood that this description is by way of example only and is not to be construed in a limiting sense. For example, operation of the high voltage generator (FIG. 2) may be regulated by application of the enable signal at lead 224 to the pump circuit in an alternative embodiment. In another embodiment, operation of reference circuits 202 and 204 may be limited to an active part of a cycle of the memory circuit when control signal RASB is low. This is accomplished by placing a third P-channel transistor in series with each reference circuit to enable the respective circuit when control signal RASB is low. This embodiment of the instant invention offers an additional advantage that no power is consumed during a standby part of the cycle of the memory circuit. In yet another embodiment, a reference voltage may be generated due to the body effect of a voltage that is negative with respect to a transistor source voltage by using an N-channel transistor. Thus, the body effect reference circuit may be used to regulate any on-chip supply voltage including a negative supply voltage for a P-type substrate.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit, comprising:
    a first reference circuit for producing a first reference voltage, responsive to a first voltage;
    a second reference circuit for producing a second reference voltage, responsive to the first voltage and a second voltage;
    a sampling circuit for storing the first reference voltage and the second reference voltage and producing a first sample voltage and a second sample voltage;
    a comparator circuit coupled to receive the first sample voltage and the second sample voltage, the comparator circuit producing a control signal in response to a difference between the first sample voltage and the second sample voltage; and
    a generator circuit including an oscillator circuit and a pump circuit, the generator circuit producing the second voltage in response to the control signal.

2. A circuit as in claim 1, wherein the control signal enables the oscillator circuit.

3. A circuit as in claim 1, wherein the control signal enables the pump circuit.

4. A circuit as in claim 1, wherein
    the first reference circuit includes a first transistor and a second transistor having current paths connected in series, the first transistor having a source terminal connected to a bulk terminal and coupled to receive the first voltage and a drain terminal for producing the first reference voltage, the current path of the second transistor coupled between the drain terminal of the first transistor and a supply voltage terminal, and
    the second reference circuit includes a third transistor and a fourth transistor having current paths connected in series, the third transistor having a source terminal coupled to receive the first voltage, a bulk terminal coupled to receive the second voltage and a drain terminal for producing the second reference voltage, the current path of the fourth transistor coupled between the drain terminal of the third transistor and the supply voltage terminal.

5. A circuit as in claim 1, wherein the sampling circuit further comprises:
    a first sample transistor for applying the first reference voltage to a first sample capacitor, responsive to a second control signal, and producing the first sample voltage at a first output terminal; and
    a second sample transistor for applying the second reference voltage to a second sample capacitor, responsive to the second control signal, and producing the second sample voltage at a second output terminal.

6. A circuit as in claim 5, further comprising an offset capacitor and an offset transistor, the offset transistor coupling the offset capacitor to one of the first or second output terminals, responsive to a third control signal.

7. A circuit as in claim 6, further comprising an equalization transistor for coupling the first output terminal to the second output terminal, responsive to an equalization signal, the equalization signal activating a precharge transistor for applying a predetermined voltage to the offset capacitor.

8. A circuit as in claim 7, further including a dynamic random access memory circuit, wherein the second voltage is applied to a word line of the dynamic random access memory circuit for selecting a row of memory cells.

9. A circuit, comprising:
    a first transistor having a gate, a bulk terminal and a current path, the bulk terminal and a first terminal of the current path of the first transistor coupled to a first voltage supply terminal for producing a first reference voltage at a second terminal of the current path of the first transistor;
    a second transistor having a gate, a bulk terminal and a current path, the bulk terminal of the second transistor coupled to a second voltage supply terminal, a first terminal of the current path of the second transistor coupled to the first supply voltage terminal for producing a second reference voltage at a second terminal of the current path of the second transistor; and
    a comparator circuit for detecting a difference between the first reference voltage and the second reference voltage, the comparator circuit producing a control signal in response to the difference.

10. A circuit as in claim 9, wherein the control signal enables a voltage generator circuit, the voltage generator circuit producing a high voltage for activating a word line of a dynamic random access memory circuit.

11. A circuit as in claim 10, wherein the voltage generator circuit further comprises an oscillator circuit and a pump circuit.

12. A circuit as in claim 10, further comprising:
    a third transistor having a current path connected in series between the second terminal of the current path of the first transistor and a third voltage supply terminal; and
    a fourth transistor having a current path connected in series between the second terminal of the current path of the second transistor and the third voltage supply terminal.

13. A circuit as in claim 12, further comprising a sampling circuit for storing a sample of the first reference voltage on a first storage capacitor and the second reference voltage on a second storage capacitor in response to a second control signal.

14. A circuit as in claim 13, further comprising an offset capacitor and an offset transistor, the offset transistor coupling the offset capacitor to one of the first or second storage capacitors in response to a third control signal.

15. A circuit as in claim 13, further comprising an equalization transistor for coupling the first storage capacitor to the second storage capacitor in response to an equalization signal.

16. A method of regulating a voltage generator circuit, comprising the steps of:
    applying a supply voltage to a first terminal of a current path of a first transistor and a bulk terminal of the first transistor;
    producing a first reference voltage at a second terminal of the current path of the first transistor;
    applying the supply voltage to a first terminal of a current path of a second transistor;
    applying another voltage to a bulk terminal of the second transistor;
    producing a second reference voltage at a second terminal of a current path of the second transistor in response to a difference between the supply voltage and an another voltage; and
    producing a control signal for controlling the voltage generator circuit in response to a difference between the first reference voltage and the second reference voltage.

17. A method of regulating a voltage generator circuit as in claim 16, further comprising the step of controlling an oscillator circuit in the voltage generator circuit in response to the control signal, the voltage generator circuit producing the another voltage.

18. A method of regulating a voltage generator circuit as in claim 16, further comprising the step of controlling a pump circuit in the voltage generator circuit in response to the control signal the voltage generator circuit producing the another voltage.

19. A method of regulating a voltage generator circuit as in claim 16, further comprising the step of activating a comparator circuit for determining the difference between the first reference voltage and the second reference voltage.

20. A method of regulating a voltage generator circuit as in claim 16, further comprising the step of coupling a first input terminal of the comparator circuit to a second input terminal of the comparator circuit before activating the comparator circuit.

21. A method of regulating a voltage generator circuit as in claim 16, further comprising the step of interrupting current flow through the current path of each of the first and second transistors during a standby part of a memory cycle of a memory circuit, thereby limiting power consumption by the memory circuit.

22. A method of regulating a voltage generator circuit, comprising the steps of:

activating a first reference circuit during an active part of a cycle in response to a first control signal;

applying a first voltage to the first reference circuit for producing a first reference voltage;

activating a second reference circuit during the active part of the cycle in response to the first control signal;

applying the first voltage and a second voltage to the second reference circuit for producing a second reference voltage;

producing a second control signal for controlling the voltage generator circuit in response to a difference between the first reference voltage and the second reference voltage; and turning off the first reference circuit and the second reference circuit during a standby part of the cycle in response to the first control signal.

23. A method of regulating a voltage generator circuit as in claim 22, further comprising the step of producing the second voltage at an output terminal of the voltage generator circuit of a synchronous dynamic random access memory circuit.

24. A method of regulating a voltage generator circuit as in claim 23, further comprising the steps of:

applying the first voltage to a first terminal of a current path of a first transistor of the first reference circuit for producing the first reference voltage at a second terminal of the current path of the first transistor; and applying the first voltage to a first terminal of a current path of a second transistor and applying the second voltage to a bulk terminal of the second transistor for producing the second reference voltage at a second terminal of the current path of the second transistor.

25. A method of regulating a voltage generator circuit as in claim 22, further comprising the step of producing the second voltage at an output terminal of the voltage generator circuit for a word line of a memory circuit, the second voltage having a magnitude greater than a magnitude of the first voltage.

26. A method of regulating a voltage generator circuit as in claim 25, further comprising the steps of:

applying the first voltage to a first terminal of a current path of a first transistor of the first reference circuit for producing the first reference voltage at a second terminal of the current path of the first transistor; and applying the first voltage to a first terminal of a current path of a second transistor and applying the second voltage to a bulk terminal of the second transistor for producing the second reference voltage at a second terminal of the current path of the second transistor.

* * * * *